United States Patent
Guo et al.

(10) Patent No.: US 7,990,225 B1
(45) Date of Patent: Aug. 2, 2011

(54) LOW-JITTER PHASE-LOCKED LOOP

(75) Inventors: Jianmin Guo, Pudong District of Shanghai (CN); Yihui Li, Pudong District of Shanghai (CN); Hong Xue, Pudong District of Shanghai (CN); Yonghua Song, Cupertino, CA (US); Tao Shui, San Jose, CA (US); Hao Zhou, Pudong District of Shanghai (CN)

(73) Assignee: Marvell International Ltd., Hamilton (BM)

( * ) Notice: Subject to any disclaimer, the term of this patent is extended or adjusted under 35 U.S.C. 154(b) by 56 days.

(21) Appl. No.: 12/498,989

(22) Filed: Jul. 7, 2009

Related U.S. Application Data

(60) Provisional application No. 61/078,962, filed on Jul. 8, 2008.

(51) Int. Cl.
*H03L 7/085* (2006.01)
(52) U.S. Cl. .............................. 331/17; 331/185; 331/57
(58) Field of Classification Search .................... 331/17, 331/185, 57
See application file for complete search history.

(56) References Cited

U.S. PATENT DOCUMENTS

| | | | | |
|---|---|---|---|---|
| 5,691,669 | A * | 11/1997 | Tsai et al. | 331/17 |
| 7,812,650 | B2 * | 10/2010 | Song et al. | 327/156 |
| 2004/0095188 | A1 * | 5/2004 | Puma et al. | 327/543 |
| 2008/0042759 | A1 * | 2/2008 | Watanabe | 331/17 |

OTHER PUBLICATIONS

A. Maxim, "Spur and Noise Reduction Techniques in Ring Oscillator Based Frequency Synthesizers for Broadcast Receiver SoCs", Silicon Laboratories Inc., 2008 IEEE, pp. 383-386.

A. Maxim, and M. Gheorghe, "A sub-1psrms jitter 1-5GHz 0.13 μm CMOS PLL Using a Passive Feedforward Loop Filter with Noiseless Resistor Multiplication",RMO3B-1, 2005 IEEE Radio Frequency Integrated Circuits Symposium, pp. 207-210.

Liang Dai and Ramesh Harjani, "Design of Low-Phase-Noise CMOS Ring Oscillators", IEEE Transactions on Circuits and Systems-II: Analog and Digital Signal Processing, vol. 49, No. 5, May 2002, pp. 328-338.

Ali Hajimiri, Sotirios Limotyrakis and Thomas H. Lee, "Jitter and Phase Noise in Ring Oscillators", IEEE Journal of Solid-State Circuits, vol. 34, No. 6, Jun. 1999, pp. 790-804.

Chan-Hong Park, and Beomsup Kim, "A Low-Noise, 900-MHz VCO in 0.6-μm CMOS", IEEE Journal of Solid-State Circuits, vol. 34, No. 5, May 1999, pp. 586-591.

* cited by examiner

*Primary Examiner* — Joseph Chang

(57) ABSTRACT

A phase-locked loop (PLL) with a decreased frequency tuning gain $K_{VCO}$ and a loop filter using capacitor multiplication technique to get high chip area efficiency. To get decreased frequency tuning gain, $K_{VCO}$, a voltage to current converter in a voltage-controlled oscillator (VCO) in the PLL may comprise a first voltage to current converter and a second voltage to current converter. The trans-conductance of the first voltage to current converter is $1/\beta$ of that of the second voltage to current converter, wherein $\beta>1$. The first voltage to current converter is controlled by an output voltage of a loop filter in the PLL, and the second voltage to current converter is controlled by a relative DC voltage, which may be the junction node between R1 and C1 in a loop filer of the PLL. Capacitor multiplication technique may use an auxiliary charge pump to charge or discharge the junction node between R1 and C1 inversely to the main charge pump. When the charge or discharge current unit of the auxiliary charge pump is α times of the main charge pump, the capacitance of C1 may be reduced to just $(1-\alpha)$ times of what it needed in a conventional loop stability compensation method, wherein $\alpha<1$.

20 Claims, 13 Drawing Sheets

LOW-JITTER PHASE-LOCKED LOOP

CROSS REFERENCE TO RELATED APPLICATION

This application claims the benefit of priority to previously filed U.S. provisional patent application Ser. No. 61/078,962, filed Jul. 8, 2008, entitled LOW-JITTER, RING BASED PHASE LOCKED LOOP WITH A VOLTAGE CONTROLLED OSCILLATOR STRUCTURE OF LOW FREQUENCY TUNING GAIN AND A LOOP FILTER STRUCTURE OF HIGH AREA EFFICIENCY. That provisional application is hereby incorporated by reference in its entirety.

BACKGROUND

1. Field of the Invention

The present invention relates generally to phase-locked loops (PLLs).

2. Description of Related Art

Phase-locked loops are widely used in electronic devices, such as computers, telecommunications equipment and radio. However, known PLLs have been insufficiently noise insensitive.

FIG. 1 illustrates a known PLL 100, which is used to maintain an output frequency $\omega_{out}$ to be a multiple times of a reference frequency $\omega_{ref}$. The PLL 100 has a phase and frequency detector (PFD) 101, a charge pump 102, a loop filter 103, a voltage-controlled oscillator (VCO) 104 and a divider 105. The VCO 104 has a voltage supply 1041 which as shown may be, e.g., a high power supply rejection (PSR) regulator, a voltage to current converter 1042 and a current-controlled oscillator (ICO) 1043. The ICO 1043 may be, e.g., a ring based oscillator. The voltage to current converter 1042, having a voltage to current converting rate $gm=I_C/V_{ctrl}$, may generate a control current $I_C$ in proportion with a control voltage $V_{ctrl}$ from the loop filter 103. The ICO 1043, having a frequency tuning gain $K_{ICO}=\omega_{out}/I_C$, may output a frequency $\omega_{out}$ based on the control current $I_C$. The divider 105 is on the feedback route from the output of the ICO 1043 to the input of the PFD 101, and may divide the output frequency $\omega_{out}$ by an integer N and send a feedback frequency, $\omega_{fb}=\omega_{out}/N$, to the input of the PFD 101.

The PFD 101 may compare the feedback frequency $\omega_{fb}$ with the reference frequency $\omega_{ref}$. When $\omega_{fb}$ is lower than the reference frequency $\omega_{ref}$, the PFD 101 may output switching signals PU and PD to the charge pump 102, closing a switch 1021 and keeping a switch 1022 open, so as to charge a charge storage device C1 in the loop filter 103. Consequently, the control voltage $V_{ctrl}$ at the output of the loop filter 103 is up, the control current $I_C$ supplied to the ICO 1043 is up, and the output frequency $\omega_{out}$ is up until it equals N $\omega_{ref}$.

When $\omega$ is higher than the reference frequency $\omega_{ref}$, the PFD 101 may generate switching signals PU and PD to open the switch 1021 and close the switch 1022, so that the charge storage device C1 in the loop filter 103 may discharge via the switch 1022. Consequently, the control voltage $V_{ctrl}$ at the output of the loop filter 103 is down, the control current $I_C$ is down, and the output frequency $\omega_{out}$ is down, until $\omega_{out}=$ N $\omega_{ref}$.

When $\omega_{fb}$ equals $\omega_{ref}$, the PFD 101 may keep both switches 1021 and 1022 closed to maintain the relationship.

The pole position and zero position of the PLL 100 are:

$$\omega_z = \frac{1}{R_1 C_1} \tag{1}$$

$$\omega_p = \frac{1}{R_1 C_2}\left(1 + \frac{C_2}{C_1}\right) \approx \frac{1}{R_1 C_2} \tag{2}$$

So the ratio between the pole and zero position is:

$$\frac{\omega_p}{\omega_z} = \frac{C_1 + C_2}{C_2} \tag{3}$$

The gain bandwidth of the PLL 100 is:

$$\omega_c \approx \frac{I_{cp}}{2*\pi} * R_1 * g_m * K_{ICO} * \frac{1}{N} \tag{4}$$

For the PLL 100, the output phase noise at the output frequency $\omega_{out}$ contributed by R1 is:

$$\phi_n^2 = 4*K*T*R_1*\left(g_m * \frac{K_{ICO}}{s}\right)^2 \tag{5}$$

wherein K is the Boltzmann constant, T is a temperature value, and $s=j\omega$, which is a variable in frequency domain.

One limitation of the known PLL 100 is its high frequency tuning gain ($K_{VCO}$), which is the frequency/voltage gain of the VCO. The high frequency tuning gain, together with a wide loop bandwidth used to suppress phase noise, may make the PLL more sensitive to the noise from the PFD, the charge pump and the loop filter. Therefore, it may be desirable to provide a PLL which may have a decreased frequency tuning gain $K_{VCO}$ and the wide loop bandwidth.

Another limitation of the known PLL 100 is that the loop filter 103 may occupy a large chip area when being integrated on a chip. One known solution uses an active loop filter, but the active device may bring additional noise. Another known solution uses a passive feed forward loop filter with noiseless resistor multiplication, but it may increase sensitivity to switching glitches of the charge pump. Therefore, it may be desirable to provide a PLL with a loop filter which has high chip area efficiency but low noise and switching glitch sensitivity.

SUMMARY

A voltage-controlled oscillator (VCO), comprising: a voltage supply; a voltage to current converter for converting a voltage signal from the voltage supply into a control current, the voltage to current converter comprising a first voltage to current converter and a second voltage to current converter coupled in parallel to produce the control current; and a current-controlled oscillator (ICO), generating an output frequency in response to the control current.

A phase-locked loop (PLL), comprising: a phase and frequency detector (PFD) for comparing a feedback frequency and a reference frequency and generating a first switching signal and a second switching signal; a first charge pump, comprising a first current source coupled in series with a first switch, a second switch and a second current source, wherein the first switch is controlled by the first switching signal, the second switch is controlled by the second switching signal and the first current source provides a current $I_{CP}$; a loop filter, comprising a first branch and a second branch coupled in parallel, wherein the first branch comprises a resistance device coupled in series with a first charge storage device, and the second branch comprises a second charge storage device; and a voltage controlled oscillator (VCO) providing an output frequency, wherein the output frequency is sent to the PFD as the feedback frequency. The VCO comprise: a voltage supply; a voltage to current converter for converting a voltage signal from the voltage supply into a control current, the voltage to current converter comprising a first voltage to current converter and a second voltage to current converter coupled in parallel to produce the control current; and a current-controlled oscillator (ICO), generating the output frequency in response to the control current.

A capacitor multiplication structure may be used in the PLL to increase the capacitance of the first charge storage device without increasing its size. The PLL may further comprise a second charge pump coupled in parallel with the first charge pump, wherein the second charge pump comprises a third current source, a third switch, a fourth switch and a fourth current source coupled in series, to charge or discharge the junction of the resistance device and the first charge storage device. The third current source provides a current $\alpha*I_{CP}$ to decrease voltage variations over the first charge storage device, and wherein $\alpha<1$. The third switch is turned on and off approximately simultaneously with the first switch, but in the opposite direction. The fourth switch is turned on and off approximately simultaneously with the second switch, but in the opposite direction.

A method for controlling a voltage-controlled oscillator (VCO), comprising: converting a voltage signal into a first control current with a first voltage to current converter; converting a voltage signal from the voltage supply into a second control current with a second voltage to current converter; combining the first control current and the second control current into a control current; and generating an output frequency in response to the control current with a current-controlled oscillator (ICO).

BRIEF DESCRIPTION OF THE DRAWING FIGURES

Embodiments are described herein with reference to the accompanying drawings, similar reference numbers being used to indicate functionally similar elements.

DETAILED DESCRIPTION

The following discussion describes a PLL with an oscillator structure having a low frequency tuning gain $K_{VCO}$ and a passive loop filter structure with noiseless capacitor multiplication.

Figure 2:
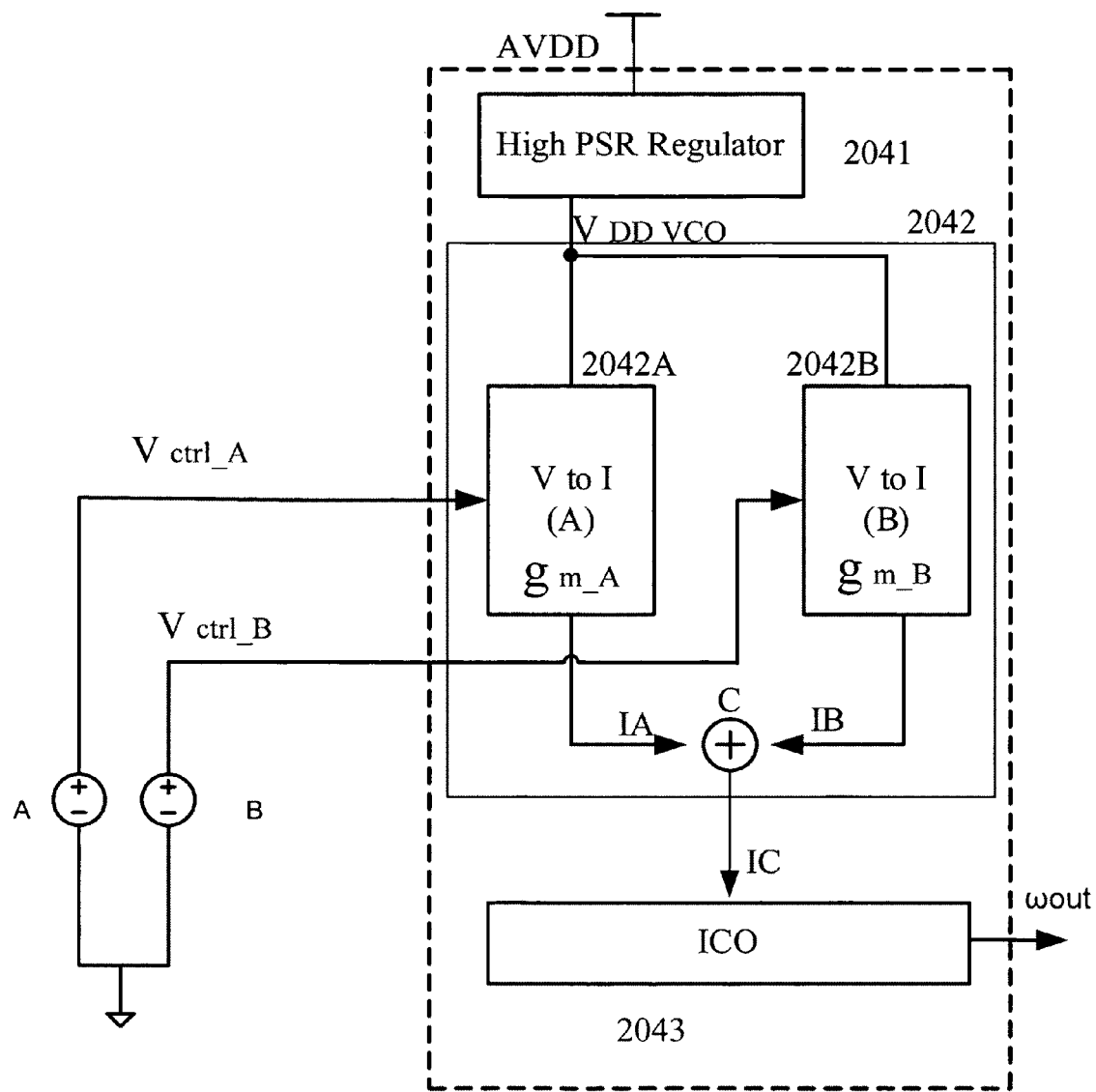
FIG. 2 is a circuit schematic depicting a VCO with a low frequency tuning gain according to one embodiment.

FIG. 2 is a circuit schematic depicting a VCO with a low frequency tuning gain according to one embodiment.

A VCO 204 may include a voltage supply such as a high PSR regulator 2041, a voltage to current converter 2042 and an ICO 2043. The voltage to current converter 2042 may include two voltage to current converters, 2042A and 2042B, coupled in parallel between the voltage supply 2041 and the ICO 2043. The converter 2042A may be controlled by a control voltage $V_{ctrl\_A}$ from a voltage source A, which may be, e.g., the output of a loop filter in a PLL. The converter 2042B may be controlled by a control voltage $V_{ctrl\_B}$ from a voltage source B, which may be, e.g., a relative DC voltage. The converter 2042A may have a voltage to current converting rate, or trans-conductance, $g_{m\_A}$, and generate a control current $I_A$ based on the control voltage $V_{ctrl\_A}$. The converter 2042B may have a trans-conductance $g_{m\_B}$, and generate a control current $I_B$ based on the control voltage $V_{ctrl\_B}$. Control currents $I_A$ and $I_B$ may be added at C and a combined control current $I_C$ may be provided to the ICO 2043.

In one embodiment, $g_{m\_A}:g_{m\_B}=1:\beta$, and $\beta>1$. Thus, in the voltage to current converter 2042:

$$g_m = g_{m\_A} + g_{m\_B} = g_{m\_A}(1+\beta) = g_{m\_B}(1/\beta+1); \quad (6)$$

$$g_{m\_A} = g_m/(1+\beta); \quad (7)$$

$$g_{m\_B} = \beta*g_m/(\beta+1); \quad (8)$$

According to equation (7), when $\beta$ is considerably greater than 1, the trans-conductance $g_{m\_A}$ of the converter 2042A may be only a small part of the trans-conductance $g_m$ of the voltage to current converter 2042.

When $V_{ctrl\_B}$ is stable, $I_B$ may be stable, and $I_C$ may only change with $V_{ctrl\_A}$. In a small signal model, the equivalent resistor of the ICO 2043 may be much larger than $1/g_{m\_A}$, and $$V_C = V_{ctrl\_A}(g_{m\_A}/(g_{m\_A}+g_{m\_B})) = V_{ctrl\_A}/(1+\beta) \quad (9)$$

Assuming that $K_{VCO}'$ is the tuning gain from $V_{ctrl\_A}$ to the output frequency, and $K_{VCO}$ is the tuning gain from $V_c$ to the output frequency, then:

$$K'_{VCO} = \omega_{out}/V_{ctrl\_A} \quad (10)$$
$$= \omega_{out}/(V_c*(1+\beta))$$
$$= K_{VCO}/(1+\beta)$$

When the trans-conductance of the VCO 204 is similar to the trans-conductance of the VCO 104 in the known PLL 100, by using two converters 2042A and 2042B and controlling the converter 2042B, whose trans-conductance is $\beta$ times the trans-conductance of 2042A, with the control voltage $V_{ctrl\_B}$ which is relatively stable and is separated from the control voltage $V_{ctrl\_A}$ for the converter 2042A, the tuning gain of the VCO 204 may be reduced to about $1/(1+\beta)$ of the tuning gain of the VCO 104 in the known PLL 100. When $\beta=4$, for example, the tuning gain of the VCO 204 may be only about ⅓ of that of the VCO 104. By adjusting the value of β, the tuning gain of the VCO 204 may be further decreased. The decrease may only need minimal circuit changes, but may make the VCO 204 significantly less sensitive to the noise from other parts in a PLL.

Figure 3:
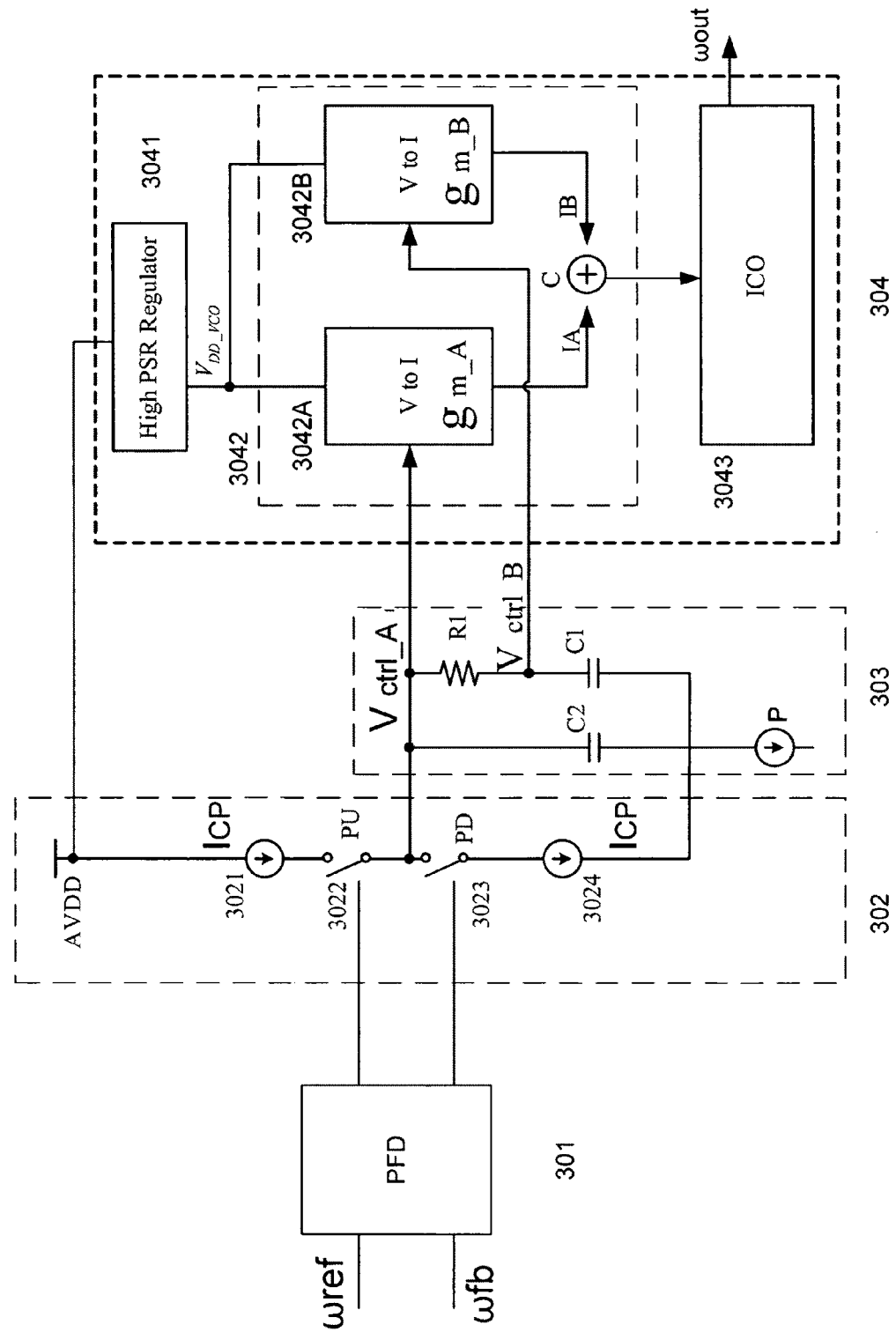
FIG. 3 is a circuit schematic depicting a PLL having a VCO with a low frequency tuning gain according to one embodiment.

FIG. 3 is a circuit schematic depicting a PLL with the VCO in FIG. 2 according to one embodiment. A PLL 300 may have a PFD 301, a charge pump 302, a loop filter 303, and a VCO 304 (corresponding to the VCO 204 in FIG. 2).

The charge pump 302 may have a current source 3021, switches 3022 and 3023, and a current source 3024 coupled in series between a fixed voltage AVDD and a fixed voltage P. Switches 3022 and 3023 may be turned on and off by switching signals PU and PD from the PFD 301 respectively, and may be, e.g., transistors. The current sources 3021 and 3024 may provide a current $I_{CP}$.

In the loop filter 303, a charge storage device C1 and a resistance device R1 may be coupled in series between the output of the charge pump 302 and the fixed voltage P, and a charge storage device C2 may be coupled between the output of the charge pump 302 and the fixed voltage P as well, in parallel with the circuit branch including the charge storage device C1 and the resistance device R1. The charge storage devices C1 and C2 may be, e.g., capacitors, and the resistance device R1 may be, e.g., a resistor. A voltage to current converter 3042A may take its control voltage $V_{ctrl\_A}$ from the junction of R1 and C2, and a voltage to current converter 3042B may take its control voltage $V_{ctrl\_B}$ from the junction of R1 and C1.

The current source 3021 may charge the charge storage device C1 via the switch 3022 and the resistance device R1 to raise the control voltages $V_{ctrl\_A}$ and $V_{ctrl\_B}$ when the switch 3022 is closed and the switch 3023 is open. Or the charge storage device C1 may discharge via the resistance device R1 and the switch 3023 to lower the control voltages $V_{ctrl\_A}$ and $V_{ctrl\_B}$ when the switch 3022 is open and the switch 3023 is closed.

As discussed above with reference to FIG. 2, the tuning gain of the VCO 304 may be about 1/(1+β) of that of the known VCO 104. The decrease in tuning gain may make the PLL 300 less sensitive to switching glitches from the charge pump 302, and the noise from the PFD 301, the charge pump 302, and the loop filter 303.

Figure 4:
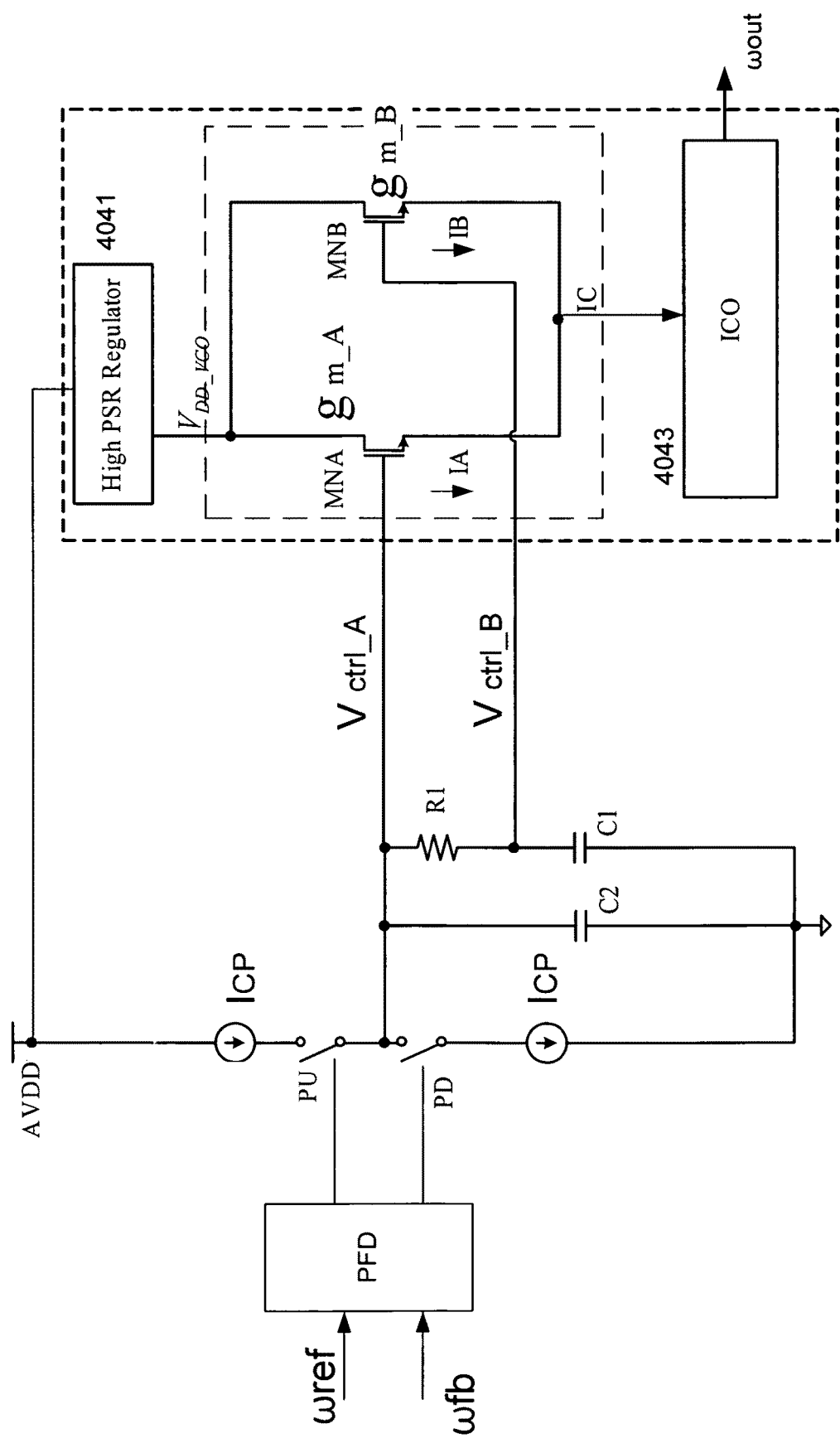
FIG. 4 illustrates an exemplary circuit implementation of the PLL in FIG. 3.
Figure 6:
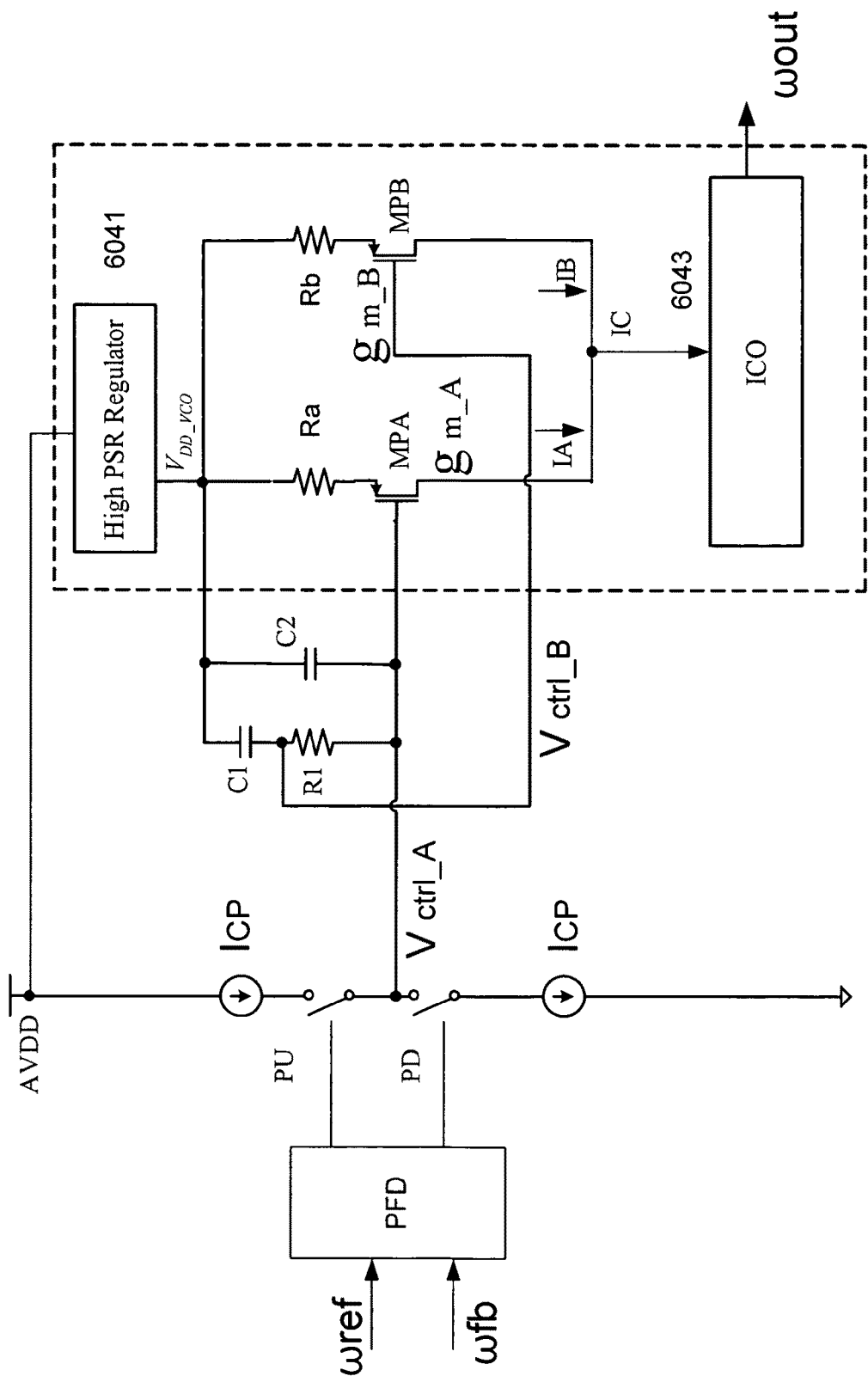
FIG. 6 illustrates an exemplary circuit implementation of the PLL in FIG. 3.
Figure 7:
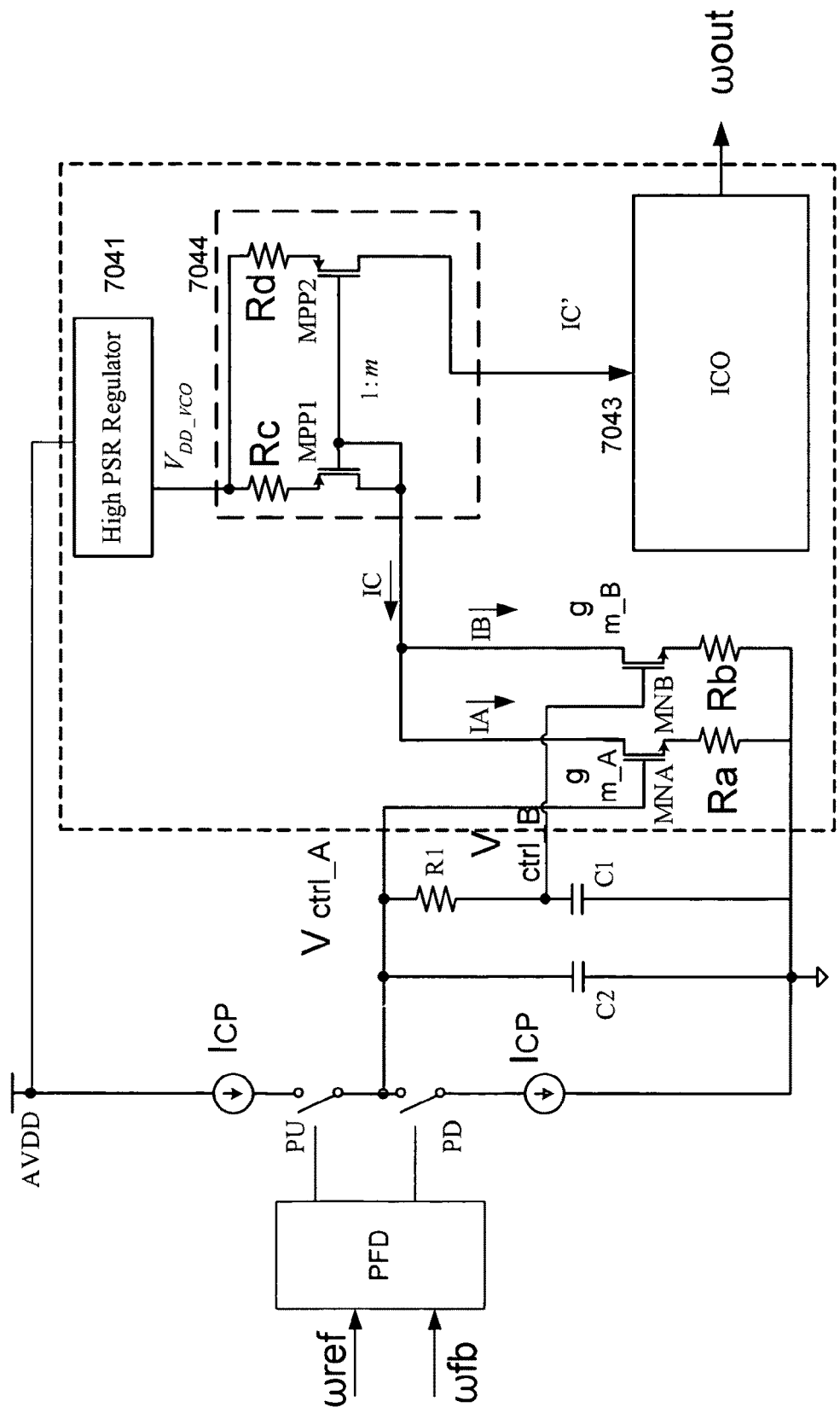
FIG. 7 illustrates an exemplary circuit implementation of the PLL in FIG. 3.

FIGS. 4, 6 and 7 illustrate exemplary circuit implementations of the PLL in FIG. 3.

In the circuit shown in FIG. 4, N-type field effect transistors (FETs) MNA and MNB may be used as the voltage to current converters 3042A and 3042B in FIG. 3, and the fixed voltage P may be ground. The trans-conductance of MNA is $g_{m\_A}$, the trans-conductance of MNB is $g_{m\_B}$, and $$g_{m\_A}:g_{m\_B}=1:\beta, \text{ and } \beta>1$$

Figure 5:
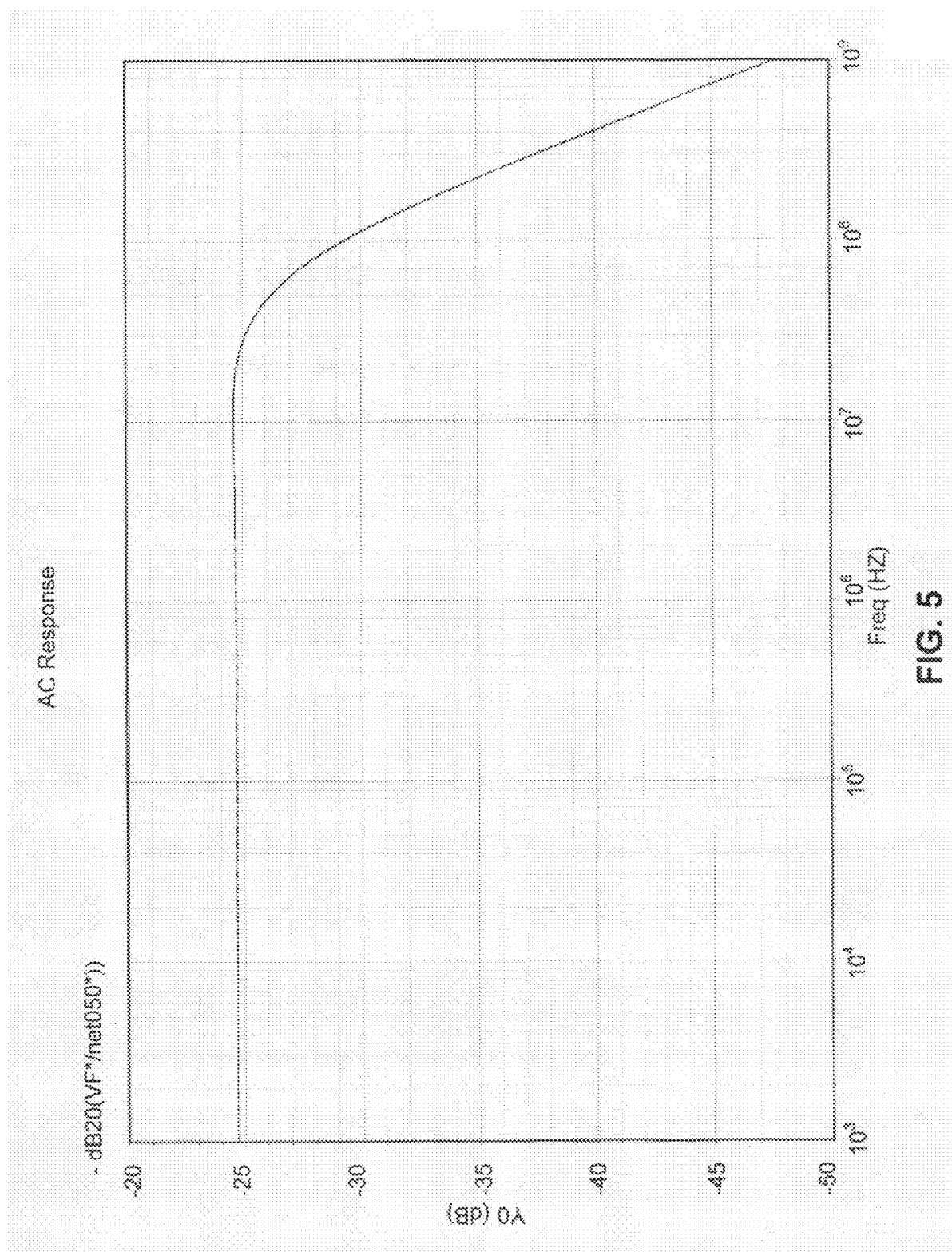
FIG. 5 illustrates an example of the PSR performance (power supply noise rejection from $V_{DD\_VCO}$ to $V_C$) of the PLL in FIG. 4.

In particular, the gate of MNA may receive the control voltage $V_{ctrl\_A}$, and the gate of MNB may receive the control voltage $V_{ctrl\_B}$. The drains of MNA and MNB may be coupled to a voltage supply such as a high PSR regulator 4041, and the sources of MNA and MNB may be coupled to an ICO 4043. The control voltage $V_{ctrl\_A}$ may control the current $I_A$ flowing through MNA, and the control voltage $V_{ctrl\_B}$ may control the current $I_B$ flowing through MNB. A control current $I_C$, which is the sum of $I_A$ and $I_B$, may control the ICO 4043. In one embodiment, MNA and MNB may be native devices, and an output noise of about −25 dB PSR from $V_{DD\_VCO}$ at the output of the voltage supply to $V_C$ at the input of the ICO 4043 may be achieved, as shown in FIG. 5.

In the circuit shown in FIG. 6, P-type FETs MPA and MPB may be used as the voltage to current converters 3042A and 3042B in FIG. 3, and the fixed voltage P may be $V_{DD\_VCO}$ at the output of a voltage supply such as a high PSR regulator 6041. The trans-conductance of MPA is $g_{m\_A}$, the trans-conductance of MPB is $g_{m\_B}$, and $$g_{m\_A}:g_{m\_B}=1:\beta, \text{ and } \beta>1$$

In particular, the gate of MPA may receive the control voltage $V_{ctrl\_A}$ from the junction of C2 and R1, and the gate of MPB may receive the control voltage $V_{ctrl\_B}$ from the junction of C1 and R1. The source of MPA may be coupled to the voltage supply 6041 via a resistor $R_a$, and the source of MPB may be coupled to the voltage supply 6041 via a resistor $R_b$. In one embodiment, $R_b=R_a/\beta$. The drains of MPA and MPB may be coupled to an ICO 6043. Thus, the control voltage $V_{ctrl\_A}$ may control the current $I_A$ flowing through MPA, and the control voltage $V_{ctrl\_B}$ may control the current $I_B$ flowing through MPB. A control current $I_C$, which is the sum of $I_A$ and $I_B$, may control the ICO 6043.

In the circuit of FIG. 7, N-type FETs MNA and MNB may be used as the voltage to current converters 3042A and 3042B in FIG. 3, and the fixed voltage P may be the ground. The trans-conductance of MNA is $g_{m\_A}$, the trans-conductance of MNB is $g_{m\_B}$, and $$g_{m\_A}:g_{m\_B}=\frac{g_m}{\beta+1}:\frac{g_m*\beta}{\beta+1}$$

$$\beta>1$$

In particular, the gate of MNA may receive the control voltage $V_{ctrl\_A}$, and the gate of MNB may receive the control voltage $V_{ctrl\_B}$. The source of MNA may be grounded via a resistor $R_a$, and the source of MNB may be grounded via a resistor $R_b$. In one embodiment, $R_b=R_a/\beta$. The drains of MNA and MNB may be coupled to a voltage supply such as a high PSR regulator 7041 via a current mirror 7044.

The current mirror 7044 may have P-type FETs MPP1 and MPP2. The junction of the gates of MPP1 and MPP2 and the drain of MPP1 may be coupled to the junction of the drains of MNA and MNB. The source of MPP1 may be coupled to the voltage supply 7041 via a resistor $R_c$, and the source of MPP2 may be coupled to the voltage supply 7041 via a resistor $R_d$. In one embodiment, $R_d=R_c/m$. The drain of MPP2 may be coupled to an ICO 7043.

The control voltage $V_{ctrl\_A}$ may control the current $I_A$ flowing through MNA, and the control voltage $V_{ctrl\_B}$ may control the current $I_B$ flowing through MNB. The reference current of the current mirror 7044 is $I_C$, which is the sum of $I_A$ and $I_B$. The output current $I_C'$ of the current mirror 7044 may be provided to the ICO 7043 as its control current, wherein $I_C'=I_C*m=(I_A+I_B)*m$.

Figure 8:
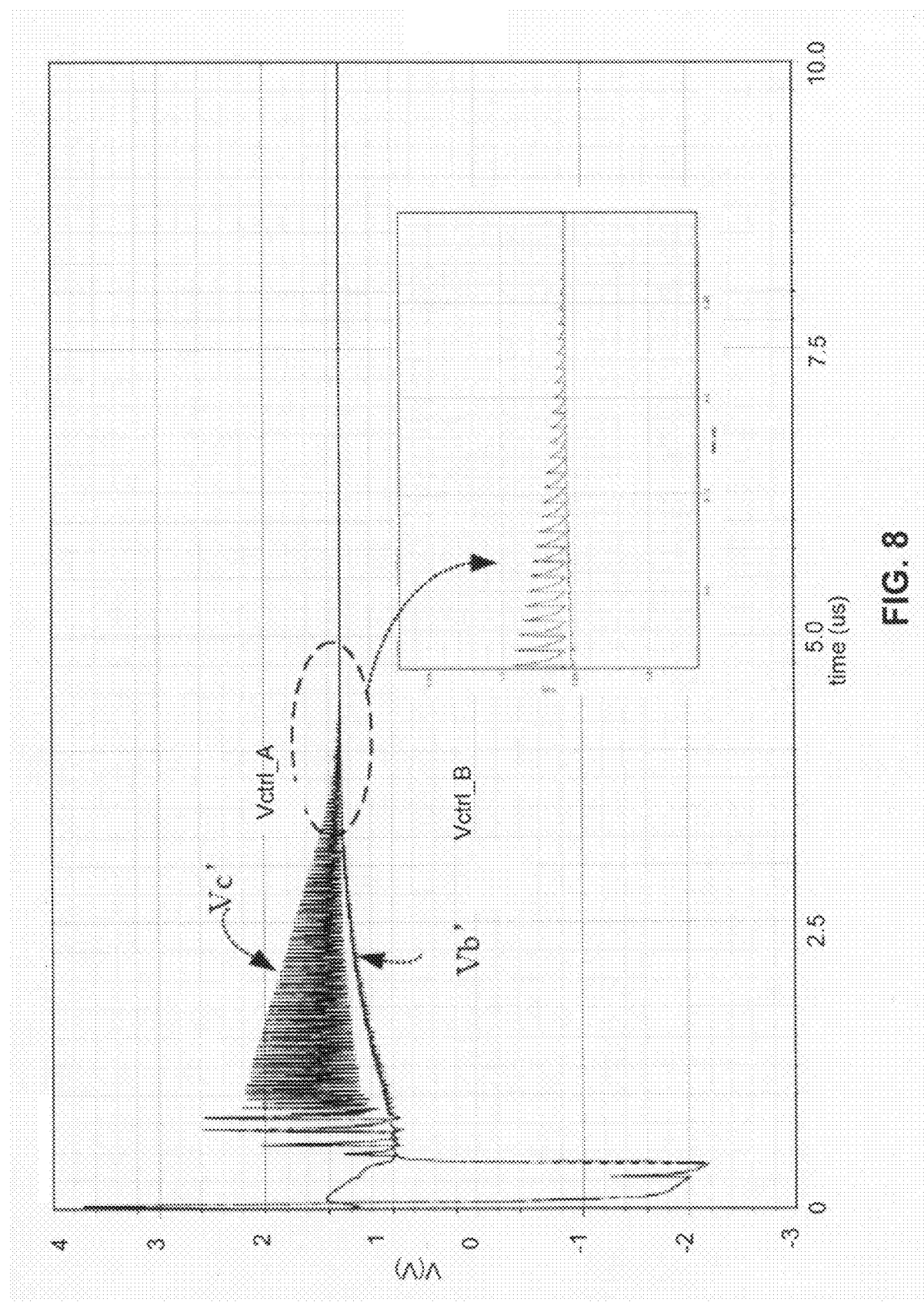
FIG. 8 illustrates a transient simulation result for control voltages $V_{ctrl\_A}$ and $V_{ctrl\_B}$ in FIG. 3 when the PLL 300 is acquiring lock.
Figure 9A:
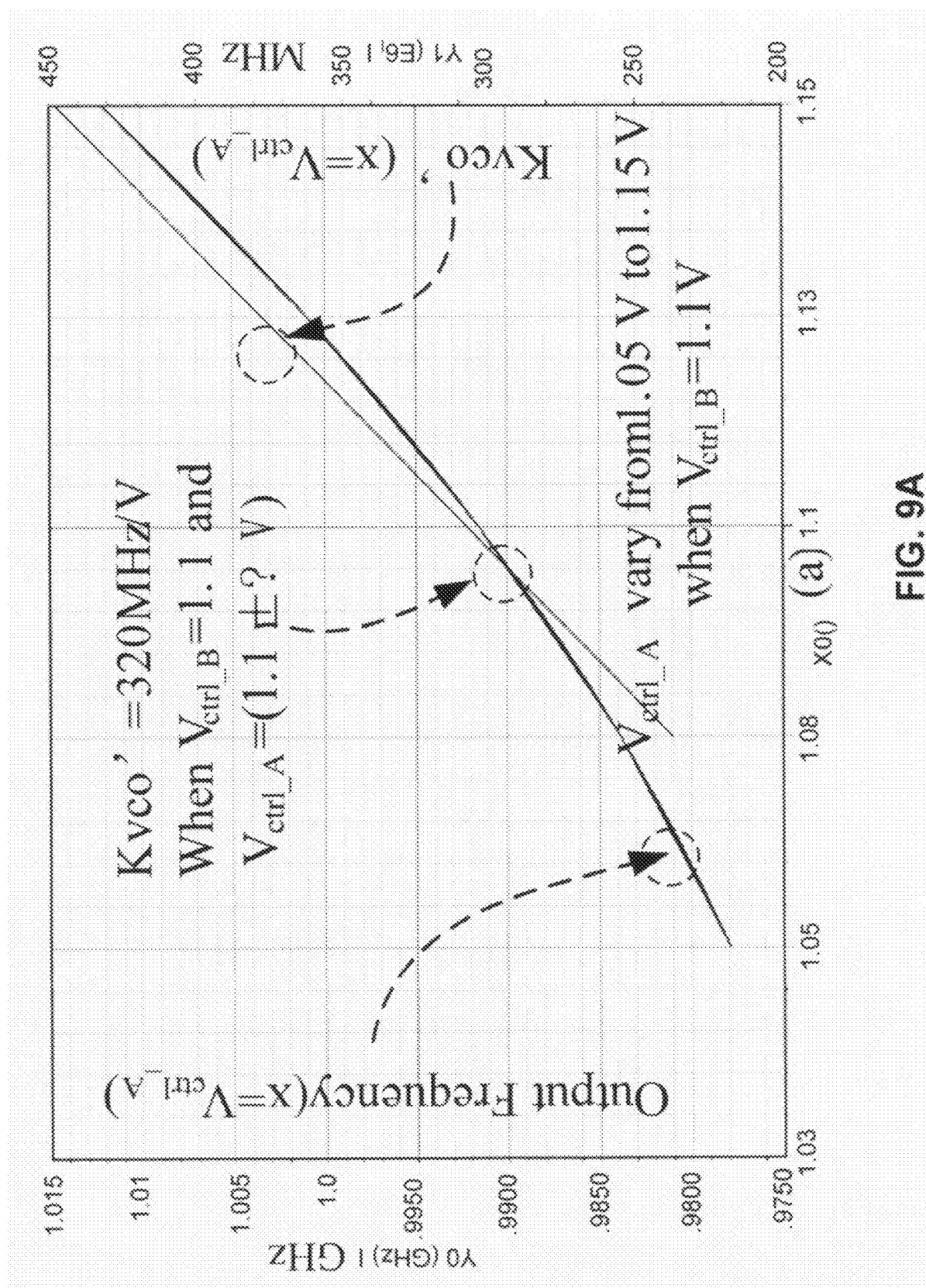
FIGS. 9A, 9B, 9C and 9D illustrate exemplary relationships between $K_{VCO}'$ and $V_{ctrl\_B}$ in the PLL of FIG. 3.
Figure 9B:
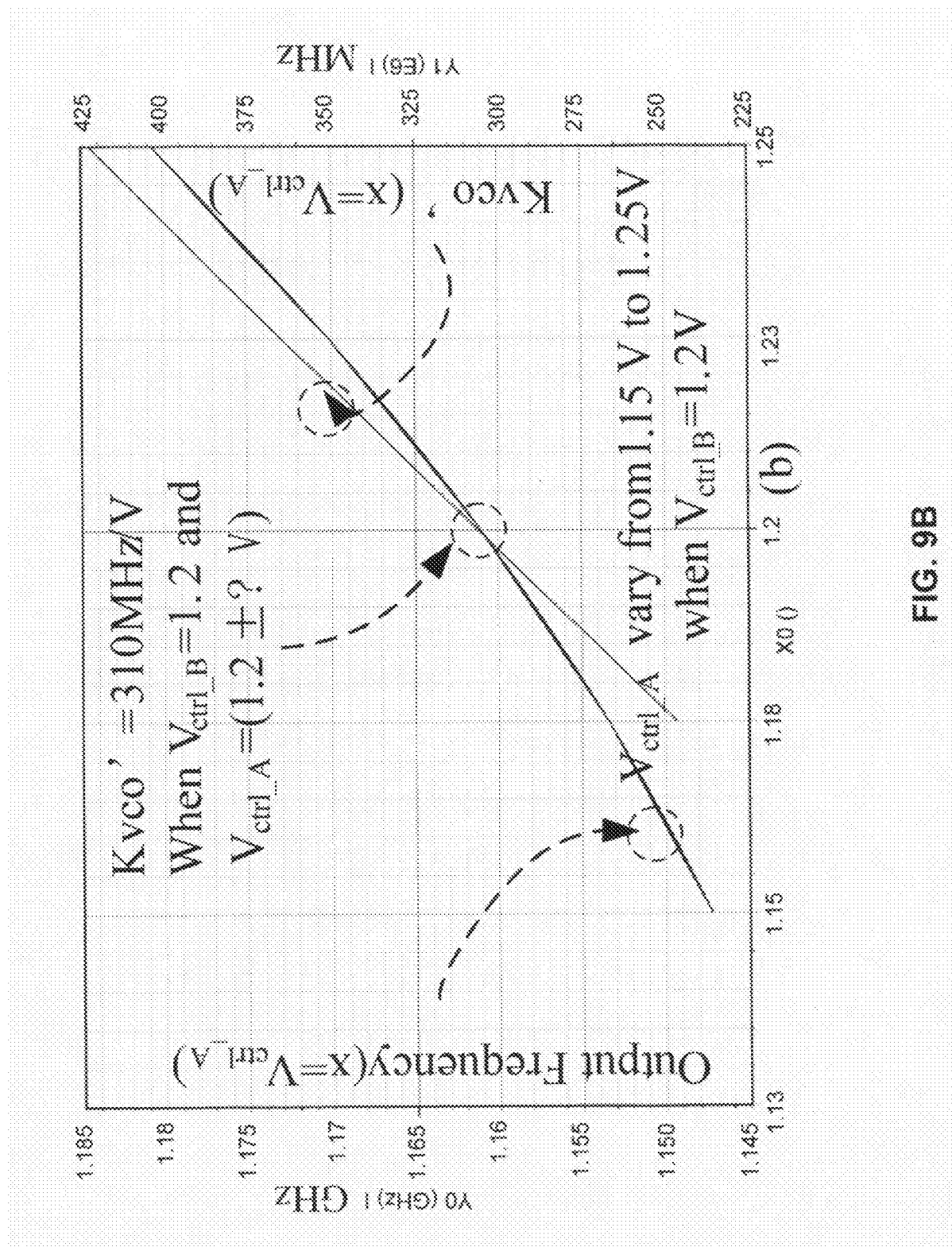
Figure 9C:
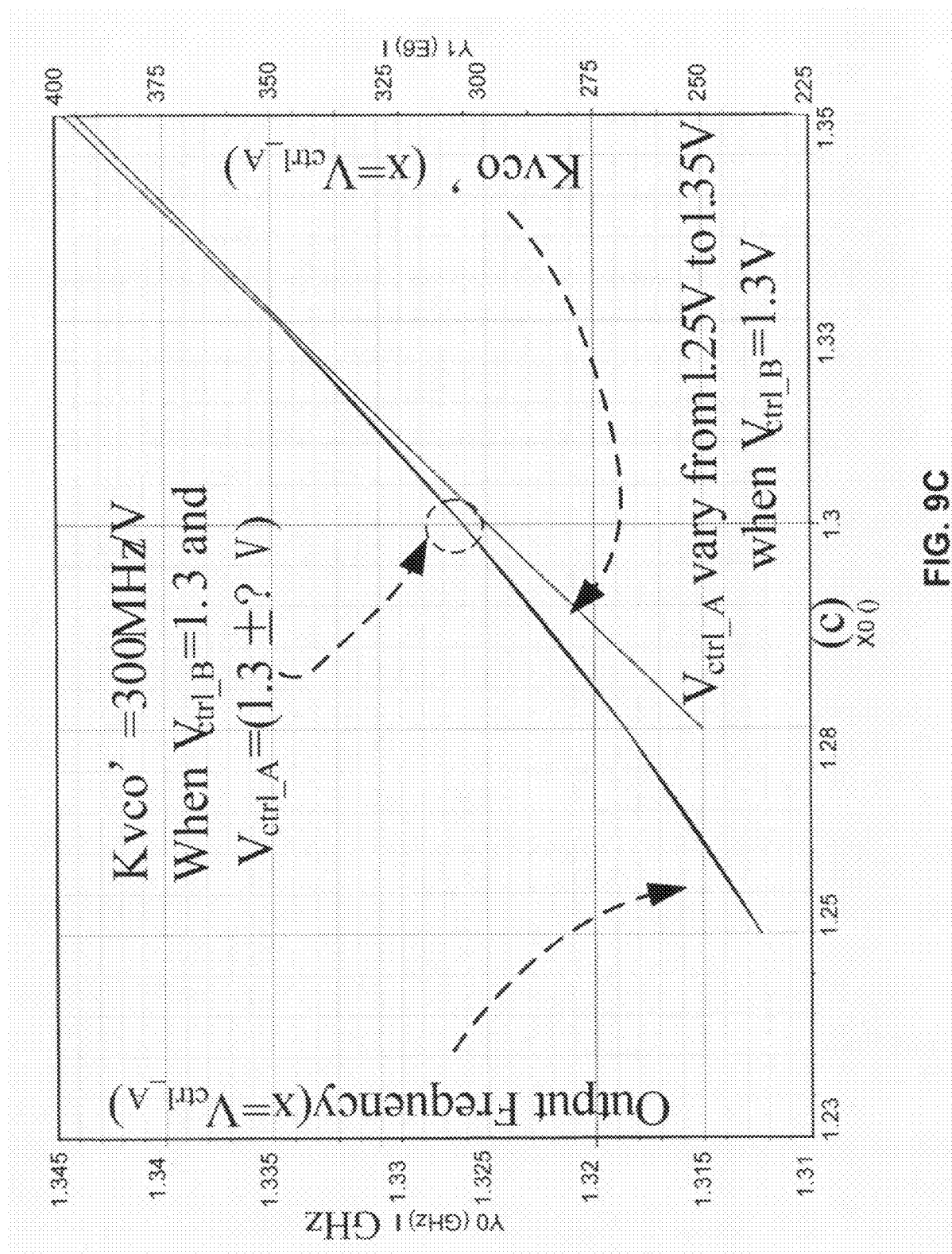
Figure 9D:
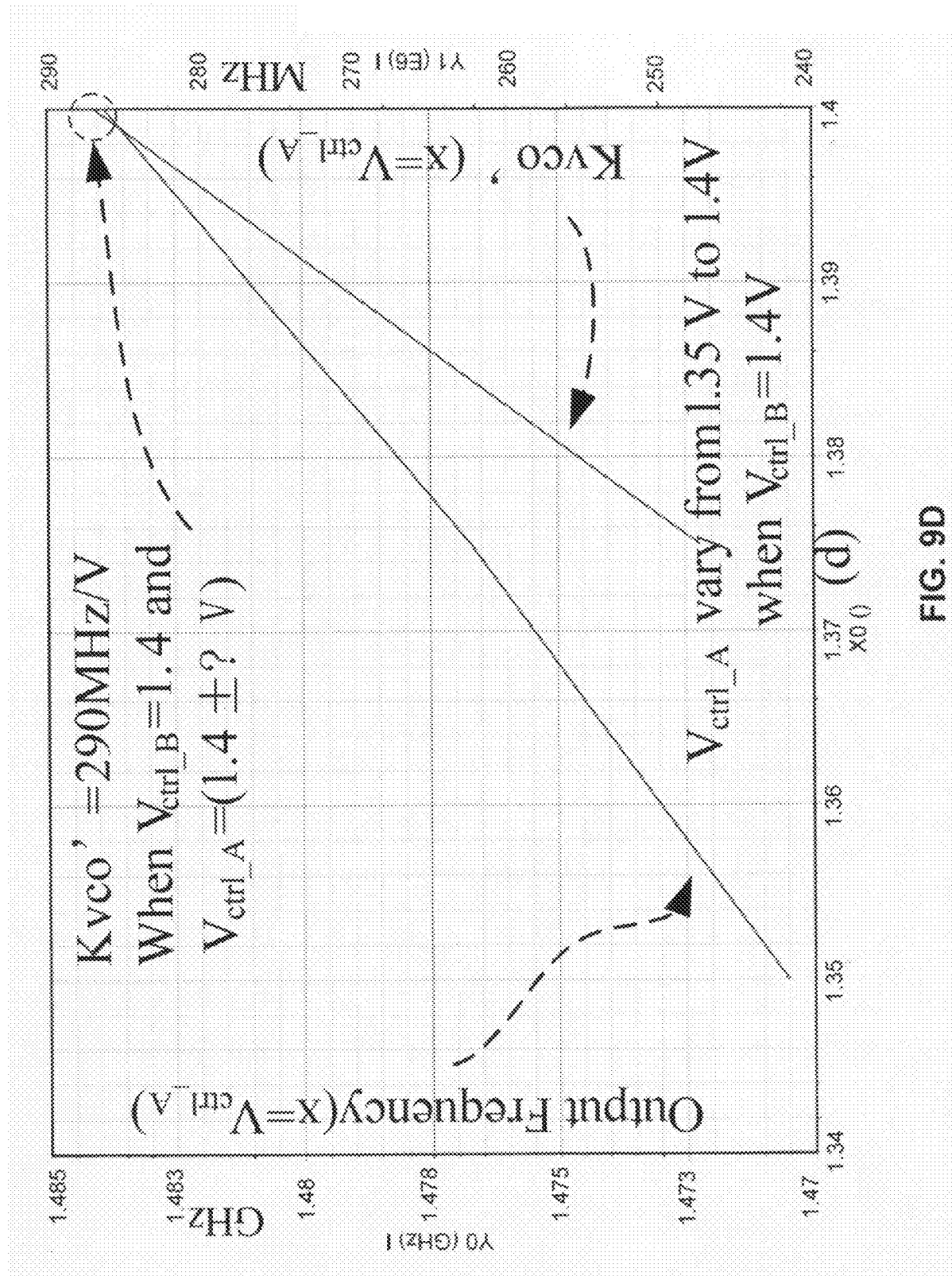

FIG. 8 illustrates a transient simulation result for $V_{ctrl\_A}$ and $V_{ctrl\_B}$ in FIG. 3 when the PLL 300 is acquiring a lock. As shown, instead of a DC voltage in FIG. 2, the control voltage $V_{ctrl\_B}$ in the PLL 300 in FIG. 3 may change with the control voltage $V_{ctrl\_A}$ slowly, and it may take a few microseconds for $V_{ctrl\_B}$ to catch up with the control voltage $V_{ctrl\_A}$. Taking the variation of $V_{ctrl\_B}$ into consideration, the frequency tuning gain of the PLL shown in FIG. 3 may be:

$$K_{VCO'} = \lim_{\Delta V \to 0} \frac{f(V_{ctrl\_A} = V_{ctrl\_B} + \Delta V) - f(V_{ctrl\_A} = V_{ctrl\_B} - \Delta V)}{2\Delta V} \quad (11)$$

FIGS. 9A, 9B, 9C and 9D illustrate exemplary relationships between $K_{VCO}'$ and the difference between $V_{ctrl\_A}$ and $V_{ctrl\_B}$, $V_{ctrl\_A} - V_{ctrl\_B}$, in the PLL 300 of FIG. 3. As shown, if $V_{ctrl\_B}$ is set to a absolutely DC value and the output frequency is scanned by increasing $V_{ctrl\_A}$ only, $K_{VCO}'$ may vary significantly with $(V_{ctrl\_A} - V_{ctrl\_B})$, changing from 220 MHz/V to 450 MHz/V. This may make the bandwidth of the PLL loop vary and deteriorate the loop stability. However, it is found that, when $V_{ctrl\_A} - V_{ctrl\_B} = 0$, Kvco' almost does not vary with the absolute value of $V_{ctrl\_B}$. Thus, in one embodiment, $V_{ctrl\_B}$ may be biased with a relative DC voltage, which may follow $V_{ctrl\_A}$ in a long period of time. One way to implement this is shown in FIG. 3, in which $V_{ctrl\_B}$ is taken from the junction of R1 and C1. Since C1>>C2, the difference between $V_{ctrl\_A}$ and $V_{ctrl\_B}$ may be a DC bias point. Furthermore, since $V_{ctrl\_B}$ is connected to $V_{ctrl\_A}$ via R1, $V_{ctrl\_B}$ may follow $V_{ctrl\_A}$ at last.

Some properties of the PLL 300 are as follows:

$$V_{ctrl\_B} = I_{CP} * \left( \frac{1}{sC_2} // \left( R_1 + \frac{1}{sC_1} \right) \right) \quad (12)$$

wherein "||" is a functor which means:

$$A // B = \frac{A * B}{A + B}.$$

$$V_{ctrl\_B} = I_{CP} * \left( \frac{1}{sC_2} // \left( R_1 + \frac{1}{sC_1} \right) \right) \frac{\frac{1}{sC_1}}{R_1 + \frac{1}{sC_1}} \quad (13)$$

When $I_A = V_{ctrl\_A} * g_{m\_A}$, $I_B = V_{ctrl\_B} * g_{m\_B}$, and $$g_{m\_A} = \frac{g_m}{\beta + 1}, \quad g_{m\_B} = \frac{g_m * \beta}{\beta + 1};$$

$$I_C = I_A + I_B = V_{ctrol\_A} * g_{m\_A} + V_{ctrl\_B} * g_{m\_B} \quad (14)$$

$$= I_{CP} * \left( \frac{1}{sC_2} // \left( R_1 + \frac{1}{sC_1} \right) \right) *$$

$$\left( \frac{1}{\beta + 1} + \frac{\beta}{\beta + 1} * \frac{\frac{1}{sC_1}}{R_1 + \frac{1}{sC_1}} \right) * g_m$$

So the open loop transfer function may be:

$$H_0(s) = \frac{I_{CP}}{2 * \pi} * \left( \frac{1}{sC_2} // \left( R_1 + \frac{1}{sC_1} \right) \right) * \quad (15)$$

$$\left( \frac{1}{\beta + 1} + \frac{\beta}{\beta + 1} * \frac{\frac{1}{sC_1}}{R_1 + \frac{1}{sC_1}} \right) * g_m * \frac{K_{ICO}}{s} * \frac{1}{N}$$

From equation (15), the pole and zero position may be:

$$\omega_z = \frac{(1 + \beta)}{R_1 C_1} \quad (16)$$

$$\omega_p = \frac{1}{R_1 C_2} \left( 1 + \frac{C_2}{C_1} \right) \quad (17)$$

$$\frac{\omega_p}{\omega_z} = \frac{1}{(1 + \beta)} \frac{C_1 + C_2}{C_2} \quad (18)$$

The gain bandwidth may be:

$$\omega_c \approx \frac{I_{cp}}{2 * \pi} * R_1 * \frac{g_m}{1 + \beta} * K_{ICO} * \frac{1}{N} \quad (19)$$

As the impedance of C1 is far smaller than that of C2, the thermal noise contributed by R1 at the junction between R1 and C1 is negligible compared to that at the junction R1 and C2. As a result, the output phase noise contributed by R1 at the output frequency $\omega_{out}$ of the PLL 300 may be:

$$\varphi_n^2 = 4 * K * T * R_1 * \left( g_{m\_A} * \frac{K_{ICO}}{s} \right)^2 \quad (20)$$

$$= 4 * K * T * R_1 * \left( \frac{g_m}{1 + \beta} * \frac{K_{ICO}}{s} \right)^2 = \left( \frac{1}{1 + \beta} \right)^2 * \phi_n^2$$

where $\phi_n^2$ is the output phase noise contributed by R1 at the output frequency $\omega_{out}$ of the PLL 100.

Compared to equation (3), equation (18) indicates that the pole over zero ratio of the PLL 300 is $1/(1+\beta)$ times of that of the known PLL 100. This will make the PLL loop unstable. In addition, equation 20 indicates that, due to the frequency tuning gain $K_{VCO}$ is reduced to $1/(1+\beta)$ times, the phase noise contribute by R1 is reduced to $1/(1+\beta)^2$ times.

One way to improve the loop stability of the PLL 300 may be to increase the value of C1 to its $(1+\beta)$ times. However, this may make the die size consumption unacceptable, since C1 is a big capacitor.

Another way to improve the loop stability of the PLL 300 may be to decrease the value of C2 to its $1/(1+\beta)$ and increase the value of R1 to its $(1+\beta)$ times. Since the resistor may become $R1*(1+\beta)$, which will contribute $4*K*T*R1*(1+\beta)$ to the noise, the noise reduction benefit depicted by equation 20 may be substituted with equation 23. Equation 23 also indicates that, in the PLL 300, the phase noise contributed by the filter resistor R1 may be improved to $1/(1+\beta)$ times of that in the PLL 100. Properties of such a PLL may be:

$$\omega_z' = \frac{(1 + \beta)}{R_1' C_1} = \frac{(1 + \beta)}{((1 + \beta) * R_1) * C_1} = \frac{1}{R_1 C_1} \quad (21)$$

-continued $$\omega'_p = \frac{1}{R'_1 C'_2} * \left(1 + \frac{C'_2}{C_1}\right) = \frac{1}{(1+\beta)*R_1 * \frac{1}{1+\beta}*C_2} * \quad (22)$$

$$\left(1 + \frac{\frac{1}{1+\beta}*C_2}{C_1}\right) \approx \frac{1}{R_1 C_2}$$

$$\varphi_n^2 = 4*K*T*R_1*\left(g_{m\_A}*\frac{K_{ICO}}{s}\right)^2 \quad (23)$$

$$= 4*K*T*(1+\beta)*R_1*\left(\frac{g_m}{1+\beta}*\frac{K_{ICO}}{s}\right)^2 = \frac{1}{1+\beta}*\phi_n^2$$

Figure 10:
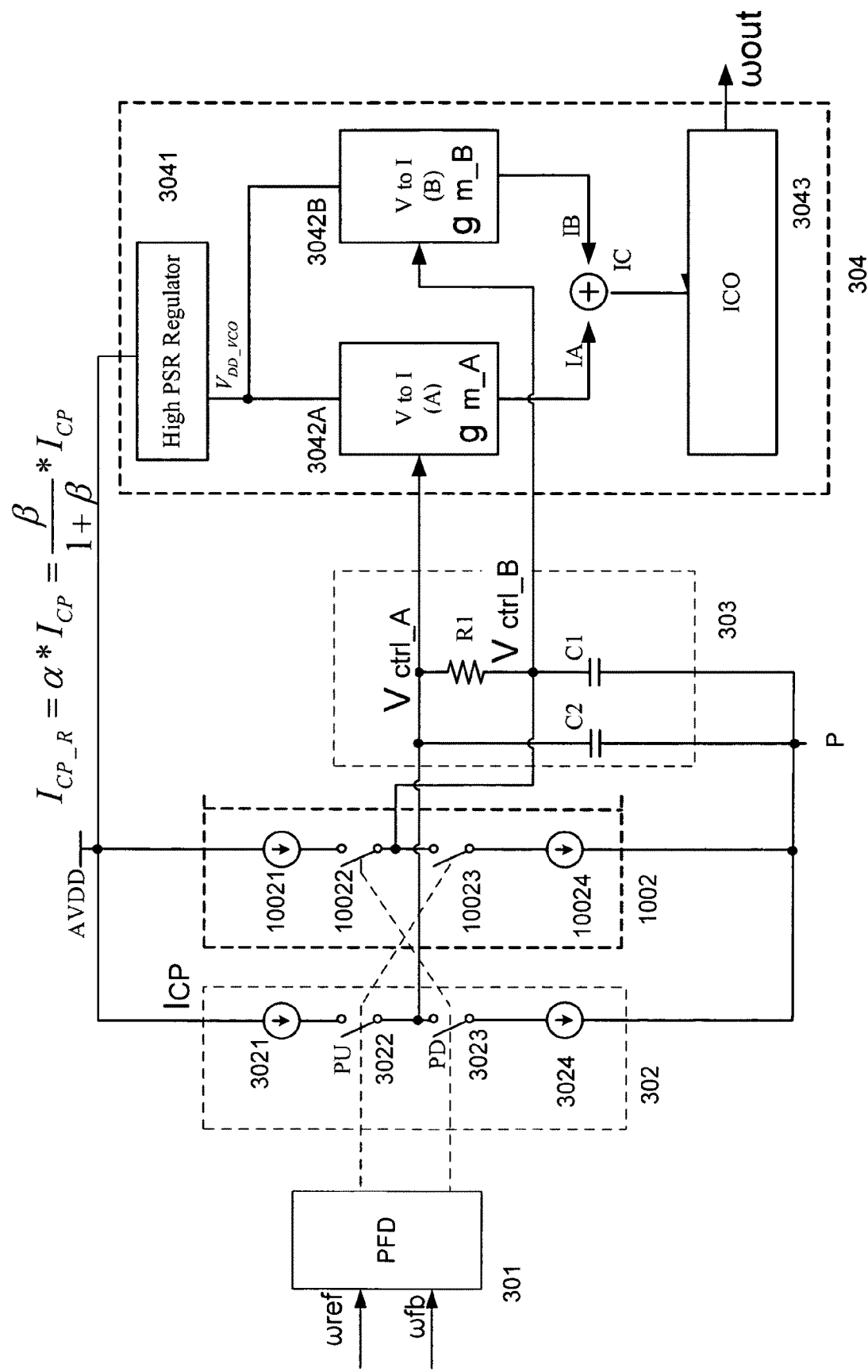
FIG. 10 is a circuit schematic depicting a PLL with the VCO in FIG. 2 and a passive loop filter with capacitor multiplication according to one embodiment.

One way to both improve the loop stability and further reduce the output phase noise of the PLL 300 is to use capacitor multiplication. FIG. 10 is a circuit schematic depicting a PLL corresponding to the PLL 300 of FIG. 3, with the VCO 304 corresponding to VCO 204 in FIG. 2, but with a passive loop filter with capacitor multiplication according to one embodiment. A replica charge pump 1002 may be added to construct an equivalent capacitor multiplication for C1. The replica charge pump 1002 may have a current source 10021, switches 10022 and 10023, and a current source 10024 coupled in series between the fixed voltage AVDD and the fixed voltage P, in parallel with the charge pump 302. The switch 10022 may be controlled by the switching signal PD from the PFD 301, and be turned on and off approximately simultaneously with the switch 3022, but in the opposite direction. The switch 10023 may be controlled by the switching signal PU from the PFD 301, and be turned on and off approximately simultaneously with the switch 3023, but in the opposite direction. The junction of R1 and C1 in the loop filter 303, from where the control voltage $V_{ctrl\_B}$ of the voltage to current converter 3042B is taken, may be coupled to the junction of switches 10022 and 10023. The current provided by the current source 10021 may be a times the current provided by the current source 3021 in the charge pump 302, wherein α<1.

When $\omega_{fb}$ is lower than the reference frequency $\omega_{ref}$, the PFD 301 may output switching signals PU and PD to the charge pump 302 and the replica charge pump 1002, closing switches 3022 and 10023 and keeping switches 3023 and 10022 open. When f<1/(C1R1), since 1/(sC2)>>(R1+1/(sC1)), most of the current $I_{CP}$ coming from the current source 3021 in the charge pump 302 may go through C1. At the same time, since 1/(sC1)<<(R1+1/sC2)), most of the current from the current source 10024 in the replica charge pump 1002, which is in the opposite direction of the current $I_{CP}$ coming from the current source 3021 and is $\alpha I_{CP}$, may go through C1 as well. Thus, the actual current going through C1 is $I_{CP}*(1-\alpha)$, and the actual voltage drop over C1 is about $I_{CP}*(1-\alpha)/(s*C1)$, which means that the equivalent value of C1 may be amplified by $1/(1-\alpha)$.

When α=⅞, for example, for each charge unit charged to C1 from the current source 3021 via the switch 3022 and R1, ⅞ of the charge unit may be drawn from C1 by the current source 10024 via R1 and the switch 10023. Thus, the value of C1 may be amplified by 8 times, without changing the size of C1 and reducing chip area efficiency, and the variation of $V_{ctrl\_B}$ in the PLL 1000 may reduce ⅞.

When $\omega_{fb}$ is higher than the reference frequency $\omega_{ref}$, the PFD 301 may send switching signals PU and PD to the charge pump 302 and 1002, keeping switches 3022 and 10023 open while closing switches 3023 and 10022. Consequently, C1 may discharge via R1 and the switch 3023 and the discharge current is $I_{CP}$. At the same time, the current source 10022 may charge C1 via the switch 10022 and R1, and the charging current may be $\alpha*I_{CP}$.

When $\omega_{fb}$ equals $\omega_{ref}$, the PFD 301 may keep the switches 3022 and 3023 in the charge pump 302 and switches 10022 and 10023 in the replica charge pump closed to maintain the relationship.

The frequency tuning gain of the PLL 1000 may be similar to that of PLL 300. However, since the variation of $V_{ctrl\_B}$ is significantly reduced, the loop stability of PLL 1000 may be much better than that of PLL 300.

Properties of the PLL 1000 may be:

$$V_{ctrl\_A} = \quad (24)$$

$$I_{CP}\left(\frac{1}{sC_2} // \left(R_1 + \frac{1}{sC_1}\right)\right) - I_{CP}\alpha\left(\frac{1}{sC_1} // \left(R_1 + \frac{1}{sC_2}\right)\right)\frac{\frac{1}{sC_2}}{R_1 + \frac{1}{sC_2}}$$

$$V_{ctrl\_B} = \quad (25)$$

$$I_{CP}\left(\frac{1}{sC_2} // \left(R_1 + \frac{1}{sC_1}\right)\right)\frac{\frac{1}{sC_1}}{R_1 + \frac{1}{sC_1}} - I_{CP}\alpha\left(\frac{1}{sC_1} // \left(R_1 + \frac{1}{sC_2}\right)\right)$$

When $I_A = V_{ctrl\_A}*g_{m\_A}$, $I_B = V_{ctrl\_B}*g_{m\_B}$, and $$g_{m\_A} = \frac{g_m}{\beta + 1}, \quad g_{m\_B} = \frac{g_m * \beta}{\beta + 1},$$

then:

$$I_C = I_A + I_B = V_{ctrl\_A}*g_{m\_A} + V_{ctrl\_B}*g_{m\_B} = \frac{1}{1+\beta}*I_{cp}* \quad (26)$$

$$\frac{s*(R_1*C_1 - R_1*C_2*\beta*\alpha) + (1+\beta)*(1-\alpha)}{s*(s*R_1*C_1*C_2 + C_1 + C_2)}*g_m$$

The open loop transfer function may be:

$$H_o(s) = \frac{I_{cp}}{2*\pi} * \frac{1}{1+\beta} * \quad (27)$$

$$\frac{s*(R_1*C_1 - R_1*C_2*\beta*\alpha) + (1+\beta)*(1-\alpha)}{s*(s*R_1*C_1*C_2 + C_1 + C_2)}*g_m*\frac{K_{ICO}}{s}*\frac{1}{N}$$

From equation (27), especially when $\alpha=\beta/(\beta+1)$, the pole and zero position may be:

$$\omega_z = \frac{(1+\beta)*(1-\alpha)}{R_1^2(C_1 - C_2*a)} = \frac{1}{R_1*(C_1 - C_2*\alpha)} \approx \frac{1}{R_1*C_1} \quad (28)$$

$$\omega_p = \frac{1}{R_1 C_2}\left(1 + \frac{C_2}{C_1}\right) \quad (29)$$

$$\frac{\omega_p}{\omega_z} = \frac{C_1 - C_2*\alpha}{(1+\beta)*(1-\alpha)} * \frac{C_1 + C_2}{C_1*C_2} \approx \frac{C_1 + C_2}{C_2} \quad (30)$$

The output phase noise contributed by R1 may be:

$$\varphi_n^2 = 4*K*T*R_1*\left(g_{m\_A}*\frac{K_{ICO}}{s}\right)^2 \quad (31)$$

$$= 4*K*T*R_1*\left(\frac{g_m}{1+\beta}*\frac{K_{ICO}}{s}\right)^2 = \left(\frac{1}{1+\beta}\right)^2*\phi_n^2$$

Figure 1:
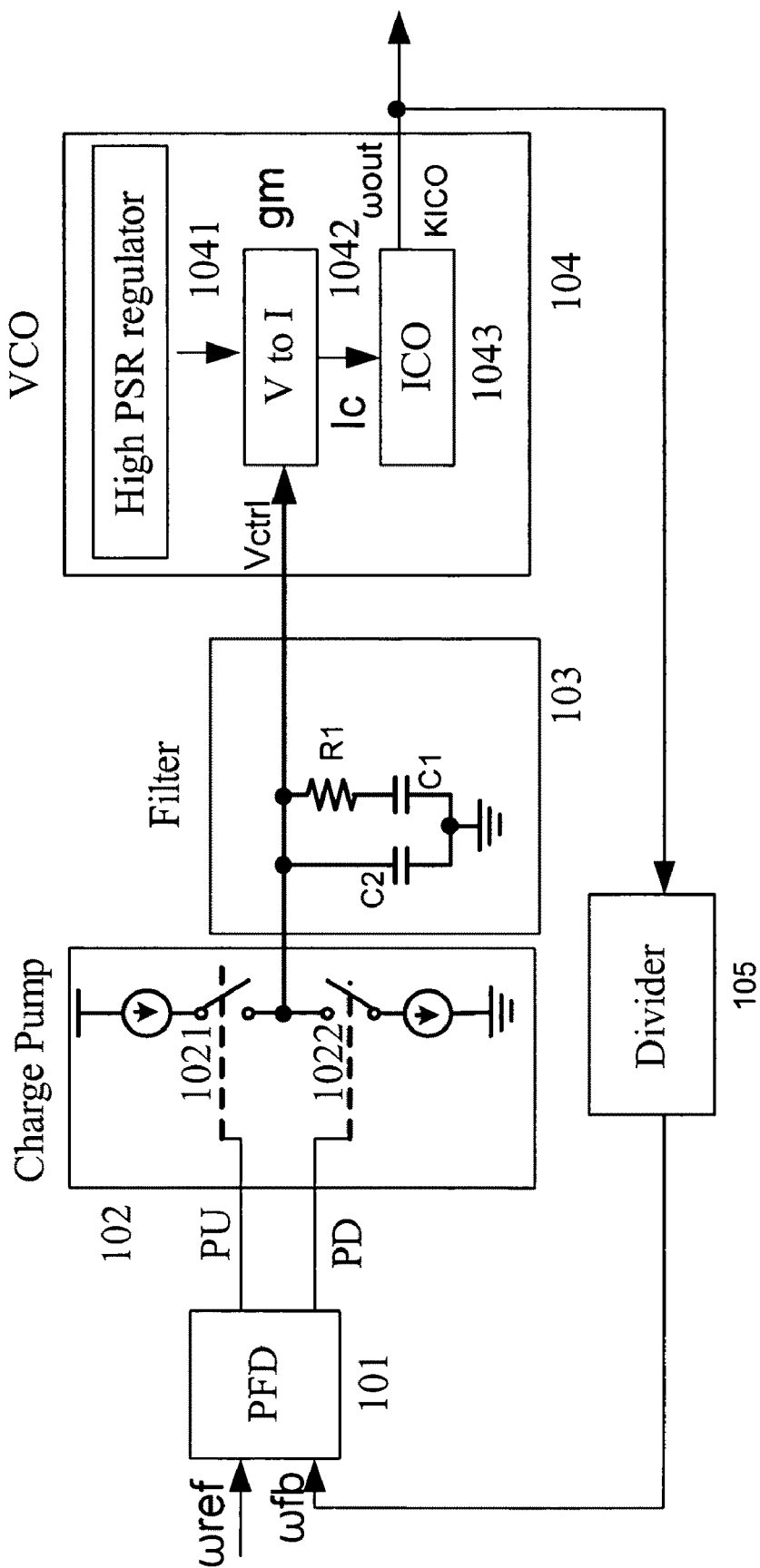
FIG. 1 illustrates a known PLL.

Equation (30) may indicate that the ratio of pole and zero position of the PLL 1000 in FIG. 10 is better than that of PLL 300 in FIG. 3 (expressed by equation (17)), and is similar to that of PLL 100 in FIG. 1 (expressed by equation (3)).

Equation (31) may indicate that the output phase noise contributed by R1 in the PLL 1000 may be $1/(1+\beta)$ times of that in the PLL 300 (expressed by equation (19)), and $1/(1+\beta)^2$ times of that in the PLL 100.

In sum, PLL 1000 and PLL 300 may reduce the frequency tuning gain to about $1/(1+\beta)$ of that of the known PLL 100. PLL 1000 may reduce the output noise contributed by R1 to $1/(1+\beta)$ times of that in the PLL 300, and $1/(1+\beta)^2$ times of that in the PLL 100. In addition, with the capacitor multiplication provided by the replica charge pump, the PLL 1000 may achieve similar loop stability of that of PLL 100 without increasing the size of C1, C2 or R1. Table 1 is an exemplary performance comparison between a known PLL 100 and a PLL 1000 according to one embodiment.

|  | Conventional Structure | This Work |
| --- | --- | --- |
| Kvco | 1.5 GHz/V | 0.3 GHz/V |
| fo | 1.3 GHz | 1.3 GHz |
| $f_{ref}$ | 26 MHz | 26 MHz |
| N | 50 | 50 |
| α | No data | 7/8 |
| β | No data | 4 |
| Icp | 270 uA | 340 uA |
| R1 | 2 kΩ | 8 kΩ |
| C1 | 120 PF | 30 PF |
| C2 | 8 PF | 2 PF |
| fc | 2.6 MHz | 2.6 MHz |
| fz | 0.65 MHz | 0.575 MHz |
| fp | 10.35 MHz | 11.04 MHz |
| Phase Margin | 60 Degree Celsius | 63 Degree Celsius |
| Phase Noise contribute by R1 at the output frequency | −106.3 dBc @ 1.5 MHz | −118 dBc @ 1.5 MHz |

Several features and aspects have been illustrated and described in detail with reference to particular embodiments by way of example only, and not by way of limitation. Alternative implementations and various modifications to the disclosed embodiments are within the scope and contemplation of the present disclosure. For example, bipolar junction transistors (BJTs) or junction gate field-effect transistors (JFETs) may be used to replace the FETs in the embodiments. Therefore, it is intended that the invention be considered as limited only by the scope of the appended claims.

What is claimed is:

1. A voltage-controlled oscillator (VCO), comprising:
   a voltage supply;
   a voltage to current converter for converting a voltage signal from the voltage supply into a control current, the voltage to current converter comprising a first voltage to current converter responsive to a first control voltage and a second voltage to current converter responsive to a second control voltage and coupled in parallel to said first voltage to current converter to produce the control current; and
   a current-controlled oscillator (ICO), generating an output frequency in response to the control current.

2. The VCO of claim 1, wherein the trans-conductance of the first voltage to current converter is 1/β of that of the second voltage to current converter, and wherein β>.

3. The VCO of claim 2, wherein the first voltage to current converter is controlled by a first control voltage, which is an output voltage of a loop filter in a phase-locked loop (PLL).

4. The VCO of claim 1, wherein the first voltage to current converter and the second voltage to current converter comprise transistors.

5. The VCO of claim 1, wherein the first voltage to current converter and the second voltage to current converter comprise field effect transistors (FETs).

6. The VCO of claim 4, wherein the current to voltage converter further comprises a current mirror coupled between a joint output of the first and second voltage to current converter and the ICO.

7. The VCO of claim 2, wherein the second voltage to current converter is controlled by a second control voltage, which is a relative DC voltage.

8. A phase-locked loop (PLL), comprising:
   a phase and frequency detector (PFD) for comparing a feedback frequency and a reference frequency and generating a first switching signal and a second switching signal;
   a first charge pump, comprising a first current source coupled in series with a first switch, a second switch and a second current source, wherein the first switch is controlled by the first switching signal, the second switch is controlled by the second switching signal and the first current source provides a current $I_{CP}$;
   a loop filter, comprising a first branch and a second branch coupled in parallel, wherein the first branch comprises a resistance device coupled in series with a first charge storage device, and the second branch comprises a second charge storage device, said loop filter producing first and second control voltages; and
   a voltage controlled oscillator (VCO) providing an output frequency and comprising:
      a voltage supply;
      a voltage to current converter for converting a voltage signal from the voltage supply into a control current, the voltage to current converter comprising a first voltage to current converter responsive to the first control voltage and a second voltage to current converter responsive to the second control voltage and coupled in parallel to the first voltage to current converter to produce the control current; and
      a current-controlled oscillator (ICO), generating the output frequency in response to the control current,
   wherein the output frequency is sent to the PFD as the feedback frequency.

9. The PLL of claim 8, wherein the first control voltage is taken from a junction of the resistance device and the second charge storage device, and the second control voltage is taken from a junction of the first charge storage device and the resistance device.

10. The PLL of claim 8, wherein the first switch is closed to charge the first charge storage device to raise the first control voltage.

11. The PLL of claim 8, wherein the second switch is closed to discharge the first charge storage device to decrease the first control voltage.

12. The PLL of claim 8, further comprising a second charge pump coupled in parallel with the first charge pump, wherein the second charge pump comprises a third current source, a third switch, a fourth switch and a fourth current source coupled in series, to charge or discharge the junction of the resistance device and the first charge storage device.

13. The PLL of claim 12, wherein the third current source provides a current $\alpha*I_{CP}$ to decrease voltage variations over the first charge storage device, and wherein $\alpha<1$.

14. The PLL of claim 12, wherein the third switch is turned on and off approximately simultaneously with the first switch, but in the opposite direction.

15. The PLL of claim 12, wherein the fourth switch is turned on and off approximately simultaneously with the second switch, but in the opposite direction.

16. A method for controlling a voltage-controlled oscillator (VCO), comprising:
    converting a voltage signal into a first control current with a first voltage to current converter responsive to a first control voltage and a second control current with a second voltage to current converter responsive to a second control voltage;
    combining the first control current and the second control current into a control current; and
    generating an output frequency in response to the control current with a current-controlled oscillator (ICO).

17. The method of claim 16, wherein the trans-conductance of the first voltage to current converter is $1/\beta$ of that of the second voltage to current converter, and wherein $\beta>1$.

18. The method of claim 16, further comprising: controlling a value of the first control current with a first control voltage, which is an output voltage of a loop filter in a phase-locked loop (PLL).

19. The method of claim 16, further comprising: controlling a value of the second control current with a second control voltage, which is a relative DC voltage.

20. The method of claim 16, further comprising: amplifying the control current with a current mirror.

* * * * *